United States Patent [19]

Michaud

[11] Patent Number: 5,268,121

[45] Date of Patent: Dec. 7, 1993

[54] COMPOSITIONS BASED ON 1,1,1,3,3-PENTAFLUOROBUTANE AND METHANOL FOR THE CLEANING AND/OR DRYING OF SOLID SURFACES

[75] Inventor: Pascal Michaud, Saint-Gratien, France

[73] Assignee: Elf Atochem, S.A., France

[21] Appl. No.: 876,160

[22] Filed: Apr. 30, 1992

[30] Foreign Application Priority Data

May 2, 1991 [FR] France .................. 91 05397

[51] Int. Cl.$^5$ .......... C11D 7/30; C11D 7/50; C23G 5/028
[52] U.S. Cl. .................. 252/171; 252/162; 252/170; 252/364; 252/DIG. 9; 134/12; 134/31; 134/38; 134/40; 134/42; 203/67
[58] Field of Search .......... 252/162, 170, 171, 364, 252/DIG. 9; 134/12, 31, 38, 40, 42; 203/67; 570/164, 177, 178

[56] References Cited

U.S. PATENT DOCUMENTS

| | | | |
|---|---|---|---|
| 4,748,223 | 5/1988 | Haruyoshi et al. | 526/206 |
| 4,842,764 | 6/1989 | Lund et al. | 252/171 |
| 4,943,622 | 7/1990 | Naraki et al. | 526/206 |
| 5,059,728 | 10/1991 | Li et al. | 570/134 |
| 5,073,291 | 12/1991 | Robeck et al. | 252/171 |
| 5,099,081 | 3/1992 | Bolmer et al. | 570/180 |
| 5,099,082 | 3/1992 | Bolmer et al. | 570/180 |

FOREIGN PATENT DOCUMENTS

| | | |
|---|---|---|
| 2009169 | 8/1990 | Canada . |
| 0325265 | 7/1989 | European Pat. Off. . |
| 0381986 | 8/1990 | European Pat. Off. . |
| 431458 | 6/1991 | European Pat. Off. . |
| 432672 | 6/1991 | European Pat. Off. . |

OTHER PUBLICATIONS

Copy of French Search Report dated Jan. 16, 1992.

*Primary Examiner*—Christine Skane
*Attorney, Agent, or Firm*—Morgan & Finnegan

[57] ABSTRACT

To replace cleaning compositions based on 1,1,2-trichloro-1,2,2-trifluoroethane (F113), the invention proposes a composition comprising, by weight, 93 to 99% of 1,1,1,3,3-pentafluorobutane (F365 mfc) and 7 to 1% of methanol. These two compounds form a positive azeotrope (b.p.=36.5° C. at normal pressure).

The composition, optionally stabilized, can be used for the cleaning and/or drying of solid surfaces, in particular for the removal of flux from printed circuits and for degreasing mechanical parts.

11 Claims, No Drawings

COMPOSITIONS BASED ON 1,1,1,3,3-PENTAFLUOROBUTANE AND METHANOL FOR THE CLEANING AND/OR DRYING OF SOLID SURFACES

FIELD OF THE INVENTION

The present invention relates to the field of fluorinated hydrocarbons. It relates more particularly to a novel composition forming an azeotrope and which can be used in drying, cleaning, degreasing and dry cleaning of solid surfaces, in particular in the removal of flux from, and the cold cleaning of, printed circuits.

BACKGROUND OF THE INVENTION 1,1,2-trichloro-1,2,2-trifluoroethane (known in the trade under the name F113) is widely used in industry for the cleaning and degreasing of solid surfaces. Apart from its application in electronics for cleaning solder flux to remove the etching flux which adheres to printed circuits, its applications for the degreasing of heavy metal parts and for cleaning high-quality and high-precision mechanical parts such as, for example, gyroscopes and military or aerospace equipment can be mentioned. In its various applications, F113 is most frequently associated with other organic solvents (for example methanol), preferably in the form of azeotropic or pseudo-azeotropic mixtures which do not separate and which, employed at reflux, have approximately the same composition in the vapor phase as in the liquid phase.

However, F113 is among the completely halogenated chlorofluorocarbons which are now suspected of attacking or of degrading stratospheric ozone.

DETAILED DESCRIPTION OF THE INVENTION

In order to contribute to the resolution of this problem, the present invention proposes to replace the compositions based on F113 with a novel composition based on methanol and 1,1,1,3,3-pentafluorobutane. This latter compound, known in the trade under the name F365 mfc, has no destructive effect in relation to ozone.

The composition to be used according to the invention comprises from 93 to 99% by weight of F365 mfc and from 7 to 1% of methanol. In this area, an azeotrope exists whose temperature of boiling is 36.5° C. at normal atmospheric pressure (1.013 bar) and the composition according to the invention has a pseudo-azeotropic behaviour, that is to say that the composition of the vapor and the liquid phases is approximately the same, which is particularly advantageous for the intended applications. Preferably, the F365 mfc content is chosen to be between 96 and 97% by weight and that of the methanol to be between 3 and 4% by weight.

The F365 mfc/methanol azeotrope is a positive azeotrope since its boiling point (36.5° C.) is lower than that of the two constituents (F365 mfc: 40° C.; methanol: 65° C.).

As in the known compositions based on F113, the composition according to the invention can be advantageously stabilized against hydrolysis and/or free radical attacks liable to occur in the cleaning processes, by adding to it a customary stabilizer such as, for example, a nitroalkane, the proportion of stabilizer being able to extend from 0.01 to 5% with respect to the total weight F365 mfc+methanol.

The composition according to the invention can be used in the same applications and according to the same techniques as the prior art compositions based on F113.

EXAMPLES

The following examples illustrate the invention without limiting it.

EXAMPLE 1

Demonstration of the Azeotrope 100 g of methanol and 100 g of F365 mfc are introduced into the boiler of a distillation column (30 plates). The mixture is then brought to complete reflux for one hour to bring the system to equilibrium. At the temperature plateau (36.5° C.), a fraction (about 50 g) is removed and analyzed by gas phase chromatography.

Examination of the results, recorded in the following table, indicates the presence of a F365 mfc/methanol azeotrope.

|  | COMPOSITION (% by weight) | |
| --- | --- | --- |
|  | F365 mfc | methanol |
| Initial mixture | 50 | 50 |
| Fraction removed | 96.2 | 3.8 |

EXAMPLE 2

Verification of the Azeotropic Composition 200 g of a mixture comprising 96.2% by weight of F365 mfc and 3.8% by weight of methanol are introduced into the boiler of an adiabatic distillation column (30 plates). The mixture is then heated to reflux for one hour to bring the system to equilibrium, then a fraction of approximately 50 g is drawn off and analysis thereof, and of the distillation bottom, is carried out by gas phase chromatography. The results recorded in the following table show the presence of a positive azeotrope since its boiling point is lower than those of the two pure constituents: F365 mfc and methanol.

|  | COMPOSITION (% by weight) | |
| --- | --- | --- |
|  | F365 mfc | methanol |
| Initial mixture | 96.2 | 3.8 |
| Collected fraction | 96.2 | 3.8 |
| Distillation bottom | 96.2 | 3.8 |
| Corrected temperature of boiling for 1.013 bar : 36.5° C. | | |

This azeotrope, employed for the cleaning of solder flux or in degreasing mechanical parts, gives good results.

EXAMPLE 3

Composition Stabilized by Nitromethane 150 g of a mixture containing 96.1% by weight of F365 mfc, 3.8% of methanol and 0.1% of nitromethane as stabiliser are introduced into an ultrasonic cleaning vessel. After the system has been brought to reflux for one hour, an aliquot of the vapor phase is removed. Analysis thereof by gas phase chromatography shows the presence of nitromethane, which indicates that the mixture is stabilized in the vapor phase.

| | COMPOSITION (% by weight) | | |
|---|---|---|---|
| | F365 mfc | methanol | $CH_3NO_2$ |
| Initial mixture | 96.1 | 3.8 | 0.1 |
| Vapor phase | 96.2 | 3.78 | 0.02 |

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

I claim:

1. An azeotropic composition or a composition which has about the same composition in the vapor phase as in the liquid phase when employed at reflux consisting essentially of, on a weight basis, from 93 to 99% of 1,1,1,3,3-pentafluorobutane and from 7 to 1% of methanol and optionally an effective amount of at least one stabilizer resulting in an azeotropic composition or a composition which has about the same composition in the vapor phase as in the liquid phase when employed at reflux boiling at about 36.5° C. at normal pressure.

2. Composition according to claim 1, wherein amounts are, by weight, from 96 to 97% of 1,1,1,3,3-pentafluorobutane and from 4 to 3% of methanol.

3. Composition according to claim 1, wherein the stabilizer is a nitroalkane.

4. Composition according to claim 1, wherein the proportion of stabilizer is from 0.01 to 5% with respect to the total weight of 1,1,1,3,3-pentafluorobutane and methanol.

5. A method for cleaning or drying a solid surface comprising applying an effective amount of the composition according to claim 1 to a solid surface.

6. The method according to claim 5, wherein the solid surface is a printed circuit or a mechanical part.

7. An azeotropic composition boiling at about 36.5° C. at normal pressure, consisting essentially of, on a weight basis, from 96 to 97% of 1,1,1,3,3-pentafluorobutane and from 3 to 4% methanol and optionally an effective amount of at least one stabilizer.

8. Composition according to claim 7, wherein the stabilizer is a nitroalkane.

9. Composition according to claim 7, wherein the proportion of stabilizer is from 0.01 to 5% with respect to the total weight of 1,1,1,3,3-pentafluorobutane and methanol.

10. A method for cleaning or drying a solid surface comprising applying an effective amount of the composition according to claim 7 to a solid surface.

11. The method according to claim 10, wherein the solid surface is a printed mechanical part.

* * * * *